United States Patent [19]

Farb et al.

[11] Patent Number: 5,686,330
[45] Date of Patent: Nov. 11, 1997

[54] METHOD OF MAKING A SELF-ALIGNED STATIC INDUCTION TRANSISTOR

[75] Inventors: Joseph E. Farb, Riverside; Maw-Rong Chin, Huntington Beach, both of Calif.

[73] Assignee: Hughes Aircraft Company, Los Angeles, Calif.

[21] Appl. No.: 716,957

[22] Filed: Sep. 23, 1996

Related U.S. Application Data

[63] Continuation-in-part of Ser. No. 402,786, Mar. 13, 1995, abandoned.
[51] Int. Cl.$^6$ .................................................. H01L 21/265
[52] U.S. Cl. ........................ 437/41 JF; 437/38; 437/203; 437/241
[58] Field of Search .......................... 437/41 JF, 40 JF, 437/38, 203, 911, 228 PL, 241

[56] References Cited

U.S. PATENT DOCUMENTS

| | | | |
|---|---|---|---|
| 4,566,172 | 1/1986 | Bencuya et al. | 437/41 JF |
| 4,713,358 | 12/1987 | Bulat et al. | 437/41 JF |
| 5,082,795 | 1/1992 | Temple | 437/41 RG |
| 5,260,227 | 11/1993 | Farb et al. | 437/911 |

*Primary Examiner*—Michael Trinh
*Attorney, Agent, or Firm*—M. E. Lachman; M. W. Sales; W. K. Denson-Low

[57] ABSTRACT

A method of fabricating self-aligned static induction transistors is disclosed. The method comprises fabricating a silicon substrate having an active area. A guard ring is formed around the active area. Source and gate regions are formed, and a self-aligned relatively deep trench in accordance with the present invention is formed over the gate regions. This is achieved by forming an oxide layer, and forming a polysilicon layer on the oxide layer. A second oxide layer is formed on the polysilicon layer which is then masked by a self-aligning mask. Trenches are etched into the source and gate regions using the self-aligning mask and gate regions are formed at the bottom of the trenches. The transistors are then processed to completion by forming gate, source and drain regions. This portion of the method comprises the steps of forming maskless self-aligned gate metallization, forming maskless self-aligned contacts to the gate metallization and filling the trench, forming source metallization, and forming a drain contact on the substrate. The method employs a single minimum geometry trench mask. The key features of the transistors are defined by the trench mask and related processing parameters. Because of the self-alignment achieved by the present invention, the number of channels per unit area is higher, which results in higher transconductance. In addition, some parasitic capacitance is eliminated by the present invention, resulting in faster operational speed. The variable sidewall trench oxide thickness allows fabrication of static induction transistors with higher or lower breakdown voltages according to the thickness that is chosen, and for a more graded gate junction.

17 Claims, 8 Drawing Sheets

SOURCE

SOURCE          GATE

SOURCE

GATE

SOURCE

GATE

METHOD OF MAKING A SELF-ALIGNED STATIC INDUCTION TRANSISTOR

This application is a continuation-in-part of patent application Ser. No. 08/402,786, filed Mar. 13, 1995, abandoned.

BACKGROUND

The present invention relates generally to integrated circuit processing methods, and more particularly to a method of making a self-aligned static induction transistor.

The prior art relating to static induction transistors are described in "Static Induction Transistors Optimized for High-Voltage Operation and High Microwave Power Output", by Izak Bencuya, et al., published in EEE Transactions on Electron Devices, Vol. ED-32, No. 7, July 1985, and "Effects of Shielded-Gate Structure on On-Resistance of the SIT with a High-Purity Channel Region", by Koji Yano, et al. published in IEEE Transactions on Electron Devices, Vol. ED-39, No. 5, July 1992, for example. Prior art static induction transistors, such as those discussed in these references are not self-aligned and are therefore slower for a given power and/or voltage level.

In addition, U.S. Pat. No. 5,260,227 assigned to the assignee of the present invention describes a method of making a self-aligned static induction transistor that is considered to be the closest prior art to the present invention. In accordance with the teachings of this patent, the method includes the following steps. An N silicon on N⁻ silicon substrate is fabricated and an active area is formed on the substrate. A guard ring is formed surrounding the active area. An $N^+$ layer is formed in the substrate that comprises source and gate regions of the transistor. An oxide layer is formed on top of the $N^+$ polysilicon layer, a polysilicon layer is formed on top of the oxide layer, and an oxide layer is formed on top of the polysilicon layer. A self-aligning mask is formed on the second oxide layer, and trenches are formed in the substrate using the self-aligning mask. Gate regions are formed at the bottom of the trenches and a first layer of metal is deposited to make contact with the gate regions. A layer of photoresist is deposited on the surface of the transistor and planarized. The first layer of metal is overetched to a predetermined depth below the top surface of the trenches. A layer of plasma nitride is then deposited on the surface of the transistor and planarized. A polysilicon mask is formed over the planarized layer of plasma nitride and the top surface of the nitride and polysilicon are etched to expose the first layer of metal in the gate regions. A second layer of metal is deposited on top of the transistor to make contact with the source and gate regions. A passivation layer is deposited on top of the transistor. Finally, interconnection pads are formed that connect to the first and second layers of metal.

The trenches formed in U.S. Pat. No. 5,260,227 were formed to a relatively shallow depth in the silicon. The depth of the trench determines the separation between the source and gate regions, and processing parameters are greatly affected by this depth. The depth of the trench produced by the method of U.S. Pat. No. 5,260,227 is on the order of from 0.25μ to 0.50μ. The $N^+$ polysilicon layer was employed to make the trench deeper to obtain proper metal coverage and planarization. However, it has been found that a more optimum trench depth of from 0.50μ to 1.50μ produces better transistor performance. Consequently, the present invention modifies the method of U.S. Pat. No. 5,260,227 to produce transistors having this greater trench depth.

It is therefore an objective of the present invention to provide a method of making a self-aligned static induction transistor that provides for relatively deep trenches, on the order of 0.50μ to 1.50μ. It is a further objective of the present invention to provide a method of making a self-aligned static induction transistor that is simpler to fabricate.

SUMMARY OF THE INVENTION

In accordance with these and other objectives, the present invention provides for a method of fabricating self-aligned static induction transistors that forms deep trenches and eliminates the need to add polysilicon to the top of the device to make the trench deeper. Although the present invention may be fabricated using N-type or P-type silicon, it is described with regard to the use of N-type silicon and compatible doping, because N-type devices are generally faster than P-type devices and would therefore typically be fabricated. The method generally comprises the following steps.

A silicon substrate is fabricated and an active area is formed on the substrate. A guard ring is formed surrounding the active area. Source and gate regions of the transistor are then formed. A self-aligned relatively deep trench is then formed in accordance with the present invention. This is achieved as follows. An oxide layer is formed on top of the $N^+$ silicon layer, a polysilicon layer is formed on top of the oxide layer, and an oxide layer is formed on top of the polysilicon layer. A self-aligning mask is formed on the second oxide layer, and trenches are formed in the source and gate regions using the self-aligning mask.

The transistors are then processed to completion by forming gate regions, and contacts to the gate, source and drain regions. This portion of the method comprises the steps of forming maskless self-aligned gate metallization, forming maskless self-aligned contacts to the gate metallization and filling the trench, forming source metallization, and forming a drain contact on the substrate metallization to complete the self-aligned static induction transistor. More specifically, this is achieved as follows.

Gate regions are formed at the bottom of the trenches and a first layer of metal is deposited to make contact with the gate regions. A layer of photoresist is deposited on the surface of the transistor and planarized. The first layer of metal is overetched to a predetermined depth below the top surface of the trenches. A layer of plasma nitride is then deposited on the surface of the transistor and planarized. Maskless self-aligned contacts to the first layer of metal (gate metallization) are formed by this set of steps. A second layer of metal is deposited on top of the transistor to make contact with the source and gate regions. A passivation layer is deposited on top of the transistor. Finally, interconnection pads are formed that connect to the first and second layers of metal.

The trench fill planarization step automatically cuts the gate contact, which eliminates the contact step in the process of U.S. Pat. No. 5,260,227. Also the trench fill planarization step eliminates the necessity of extending the gate contact outside the field edge and concerns about its continuity over that particular step. The planarized trench fill step is very tapered, thus allowing good contact metal step coverage. The present method also provides a nonuniformly doped epitaxial layer to increase the device performance at a given device operating voltage limitation.

The present invention is an improvement upon the processing method of U.S. Pat. No. 5,260,227. The following changes have been made with respect to the method of U.S. Pat. No. 5,260,227. The present method eliminates the thick polysilicon deposition and trenches penetrate deeper into the single crystal silicon to a distance of about 0.75 microns or more. Elimination of the thick polysilicon layer early in the process means it is not necessary to take it off the field later in the process. Contact to the gate is now made by the planarization of plasma nitride in an extra wide (about 10 microns or more) gate trench at the side of the device. A non-uniformly doped epitaxial layer is used to optimize device speed and operating voltage. The epitaxial layer is more heavily doped near the top and lightly doped towards the bottom of the layer adjacent the $N^+$ substrate interface.

The present method employs only one minimum geometry mask, namely the trench mask. All of the key features of the transistor are defined by the trench mask and related processing parameters. Because of the self-alignment provided by this invention, the number of channels per unit area is higher, which results in higher transconductance. In addition, some of the parasitic capacitance normally found in static induction transistors is also eliminated by the present invention. The static induction transistors produced by this invention are faster and handle more power than their non-self-aligned counterparts.

The present invention permits the production of a variable sidewall trench oxide thickness. This allows fabrication of static induction transistors with higher or lower breakdown voltages according to the thickness that is chosen. Thicker oxides allow for a more graded P gate junction.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
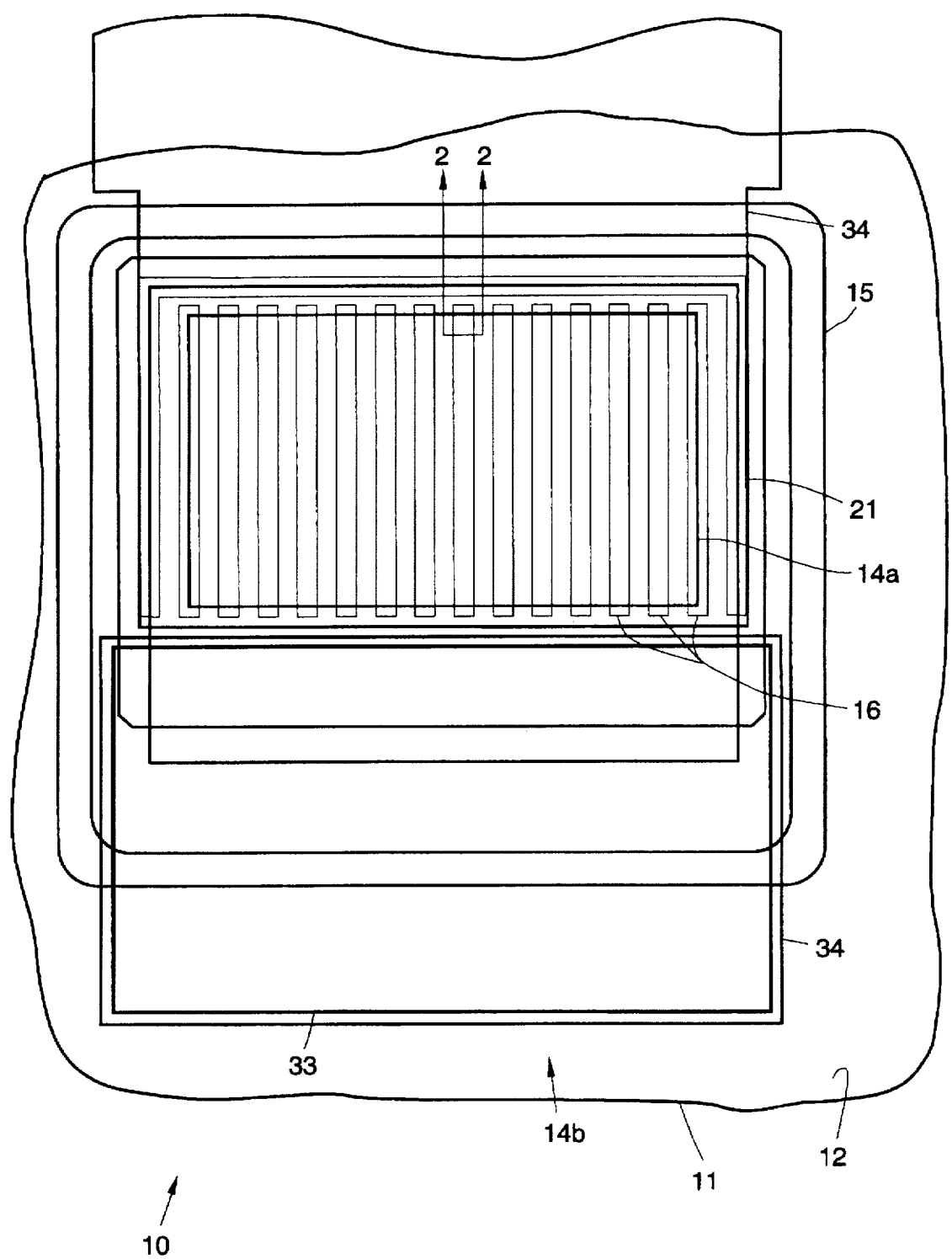
FIG. 1 shows an exposed top view of a static induction transistor made in accordance with the present invention.

Referring to the drawing figures, FIG. 1 shows an exposed top view of a representation of a self-aligned static induction transistor 10 made in accordance with a processing method 40 (FIG. 12) of the present invention. FIGS. 2–11 show relevant steps in the processing method 40 that produces the self-aligned static induction transistor 10. FIG. 1 shows an $N^+$ silicon substrate 11 having an epitaxial layer of N silicon 12 on a top surface thereof. A guard ring 15 surrounds an active area 14a of the transistor 10. The active area 14a is derived from etching a larger active area which is reduced in size by the etching procedure. A $P^+$ trench 21 is provided having relatively long, narrow strips comprising an $N^+$ silicon layer 13 that comprise source and gate regions of the transistor 10. A field region 14b is also provided. A prepad mask 33 is shown that will be described below with reference to the processing steps in the present method 40. A metallization layer 34 (second layer of metal 34) is shown and is disposed on top of the transistor 10 that contacts source and gate regions.

Figure 2:
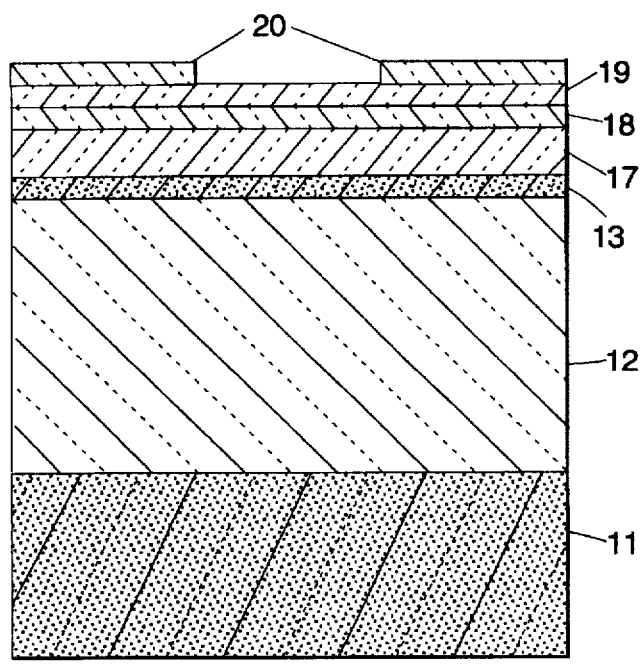
FIGS. 2–11 show relevant steps in a processing method of the present invention and a cross section of the resulting self-aligned static induction transistor.

Referring to FIGS. 2–11, the process flow of the processing method 40 is as follows. FIGS. 2–11 show cross sections, taken along lines 2—2 (in the active area 14a) in FIG. 1, during the processing method 40. In FIG. 2, the N+ silicon substrate 11 is processed to grow the epitaxial layer of N silicon 12 on the top surface thereof. The N+ silicon substrate 11 comprises a drain (or drain region) of the transistor 10. Then, a thermal oxide layer comprising a pad oxide (not shown) is grown on top of the epitaxial layer of N silicon 12, and a silicon nitride layer (not shown) is deposited onto the thermal oxide layer. An active area mask (not shown) is then deposited on top of the silicon nitride layer. The active area 14a is etched through the silicon nitride layer using the active area mask. The active area mask is then removed.

A guard ring mask (not shown) is then formed over the top surface of the transistor 10. The guard ring 15 is implanted around the active area 14a of the transistor 10 through the guard ring mask. A field oxide layer is then grown over the top surface of the field region 14b, which shrinks the active area 14a to a smaller size. The silicon nitride layer is then stripped. The above processing steps are generally performed in fabricating conventional self-aligned static induction transistors 10.

The wafer is then implanted through a mask with $N^+$ silicon dopant ions to produce a thin $N^+$ layer 13 in the substrate 11. (The $N^+$ silicon layer 13 subsequently becomes the source and gate regions of the transistor 10, as described below.) Thermal oxide is then grown over the $N^+$ layer 13 to a thickness on the order of 500 Å, and additional oxide is deposited on top of the thermal oxide to a thickness of about 4000 Å to form a relatively thick oxide layer 17. A layer of polysilicon 18 is deposited on top of the thermal oxide layer 17 using a low temperature deposition procedure. The layer of polysilicon 18 is typically on the order of 1500 Å thick. Then, a high temperature dry oxidation procedure is employed to form a second oxide layer 19 on top of the layer of polysilicon 18. The second oxide layer 19 is typically on the order of 400 Å thick. When the layer of polysilicon 18 and the relatively thick oxide layer 17 are formed on the front or top side of the wafer, corresponding layers of polysilicon (not shown) and relatively thick oxide (not shown) are also formed on the back or bottom side of the wafer. A back etch procedure is then used to remove the layer of polysilicon and the relatively thick oxide layer on the back of the wafer prior to subsequent processing of the back of the wafer. The back etch procedure may use plasma or a wet etch, for example.

Figure 3:
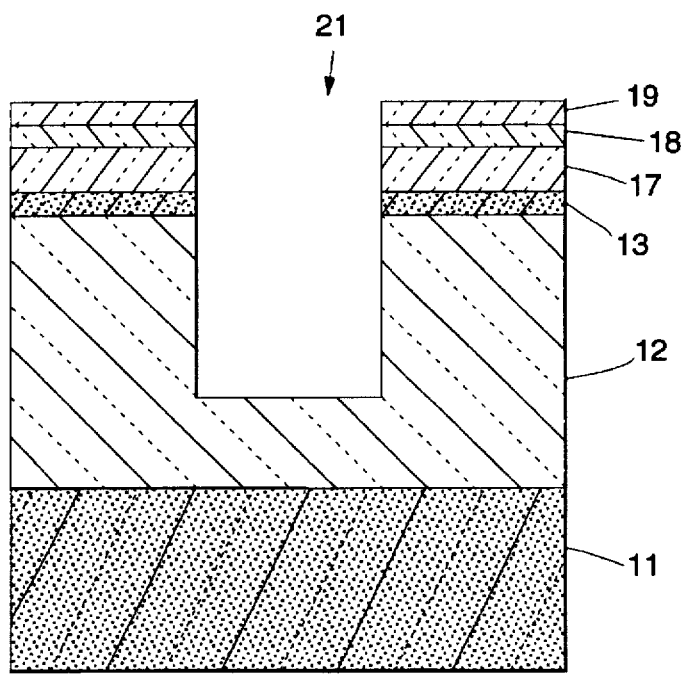
Figure 13A:
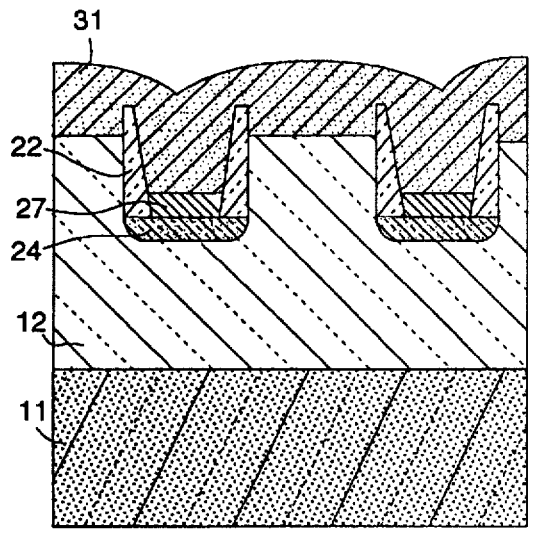
FIG. 13a shows the narrow trenches over the source regions completely filled with plasma nitride material.
Figure 13B:
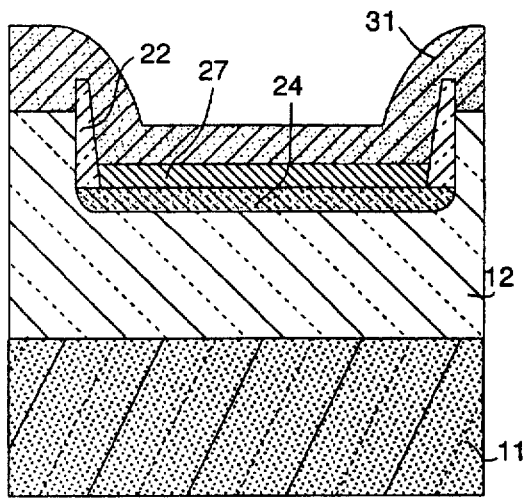
FIG. 13b shows the wide trench over the gate region partially filled with plasma nitride material.

A trench mask 20 is formed over the surface of the transistor 10, and referring to FIG. 3, the trenches 21 are formed in the epitaxial layer of N silicon 12. The trenches 21 are etched using an anisotropic etching procedure which etches through the second oxide layer 19, the layer of polysilicon 18, and the thick oxide layer 17, to the surface of the $N^+$ silicon layer 13. A trencher is then used to trench into the $N^+$ silicon layer 13 and into the epitaxial layer of N silicon 12. The trenches are preferably about 0.50 to 1.50 micrometers deep, most prefereably about 0.75 micrometers deep. As can be seen in FIGS. 13a and 13b, the trench formed over the source region is relatively narrow as compared to the trench formed over the gate region. The anisotropic etching procedure produces vertical sidewalls in the trenches 21. The trench mask 20 is removed, such as with acid. After etching the trenches 21, a post trench stripping procedure is used to remove the oxide on the sidewalls of the trenches 21. This stripping procedure may use diluted hydrofluoric acid, for example.

Figure 4:
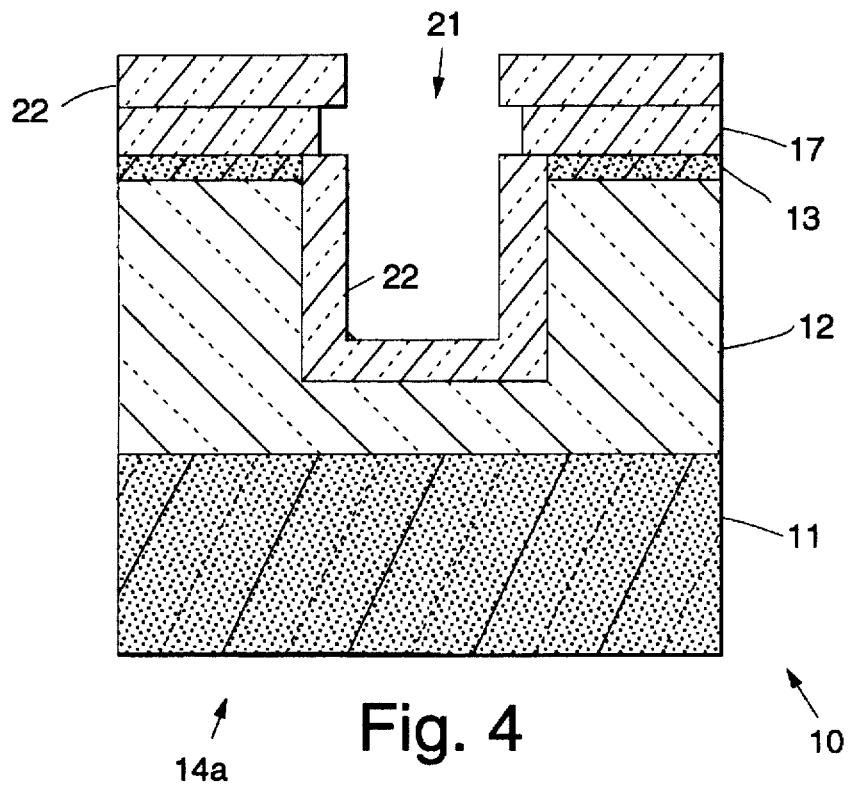

Referring to FIG. 4, after etching of the trenches 21 into the epitaxial layer of N silicon 12, a second layer of thermal oxide 22 is grown in the trenches 21, along the sidewalls of the trenches 21, and on top of the relatively thick oxide layer 17, which completely oxidizes the layer of polysilicon 18. The oxidized second layer of polysilicon 18 and oxide layer 19 are thus merged into the second layer of thermal oxide 22. The second layer of thermal oxide 22 is typically on the order of 3000 Å thick.

Figure 5:
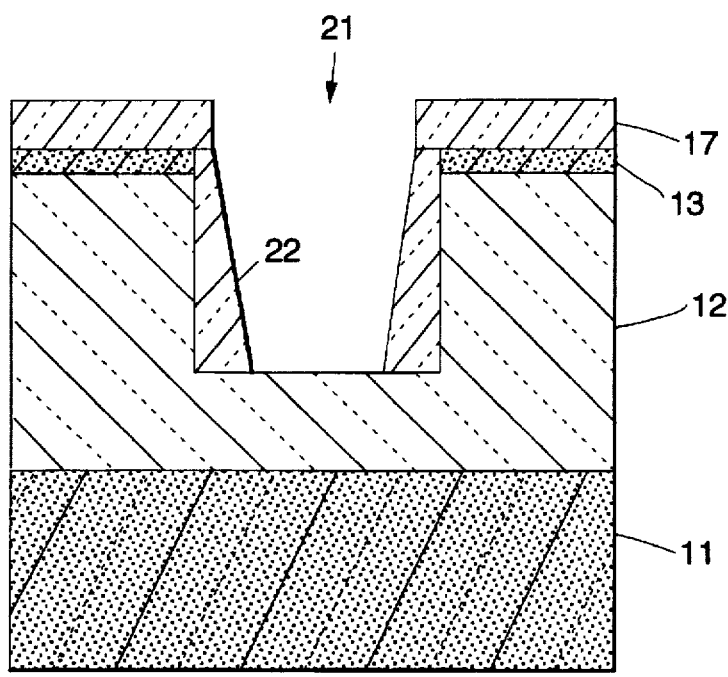

Referring to FIG. 5, the second layer of thermal oxide 22 is etched using an anisotropic dry etch, for example. This etching procedure tapers the sidewalls of the second layer of thermal oxide 22 along the sidewalls of the trenches 21. The topmost portion of the second layer of thermal oxide 22 is removed, the trench sidewalls are tapered, and the epitaxial layer of N silicon 12 is exposed at the bottom of the trenches.

Figure 6:
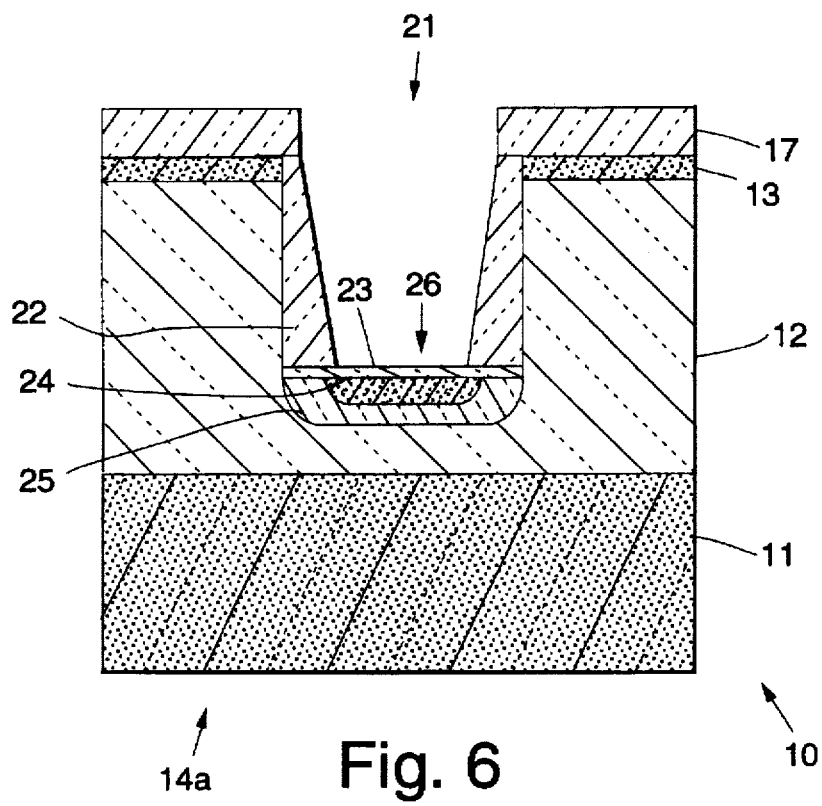

Referring to FIG. 6, a layer of gate oxide 23 that provides a spacer is grown on top of the exposed layer of N silicon 12. The layer of gate oxide 23 is typically on the order of 210 Å thick. Then a P-grade implant and annealing procedure is performed to produce a P-grade layer 25. The annealing procedure occurs at a temperature of about 1050 degrees Celsius, for about 30 minutes. P type dopant ions are implanted and driven in a furnace to form the P-grade layer 25 which provides gate regions 26 of transistor 10. Then, a high dose of P type dopant ions are implanted into the structure and subjected to a rapid thermal annealing procedure, to form layer 24, which is the $P^+$ ohmic contact to the gate. The rapid thermal annealing occurs at a temperature of about 1100 degrees Celsius, for about 10 seconds. A wet oxide stripping procedure is then performed to strip the gate oxide layer 23 from the gate regions 26 of the transistor 10.

An important feature of the present invention is the variable sidewall trench oxide thickness provided the second layer of thermal oxide 22. The ability to provide for variable sidewall trench oxide thickness allows fabrication of static induction transistors 10 with higher or lower breakdown voltages according to the thickness that is chosen. A thicker layer of thermal oxide 22 along the sidewalls allows for a more graded $P^+$ gate junction.

Figure 7:
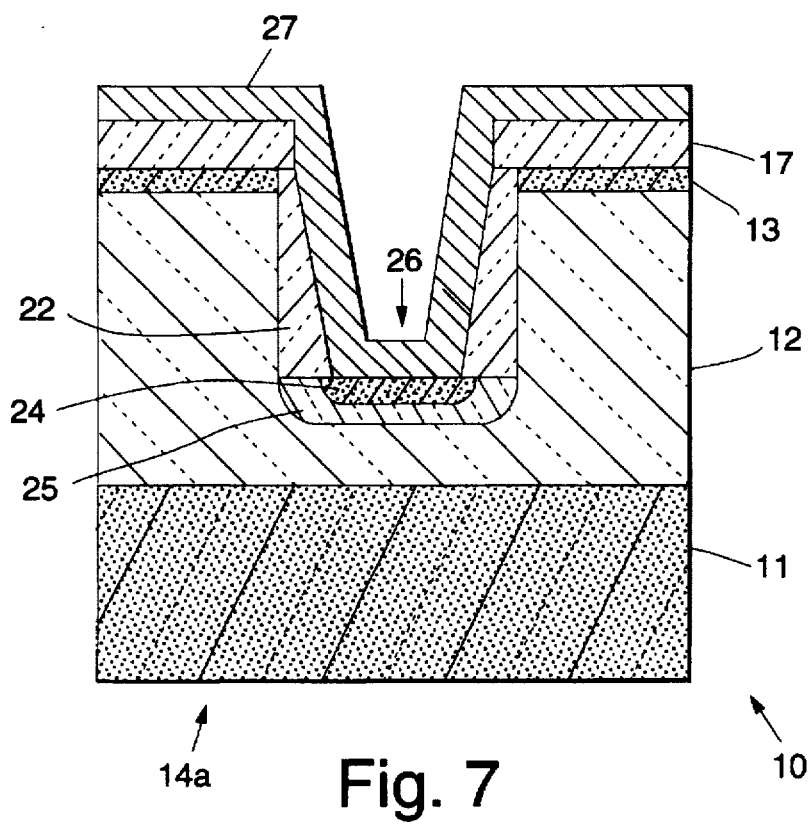
Figure 8:
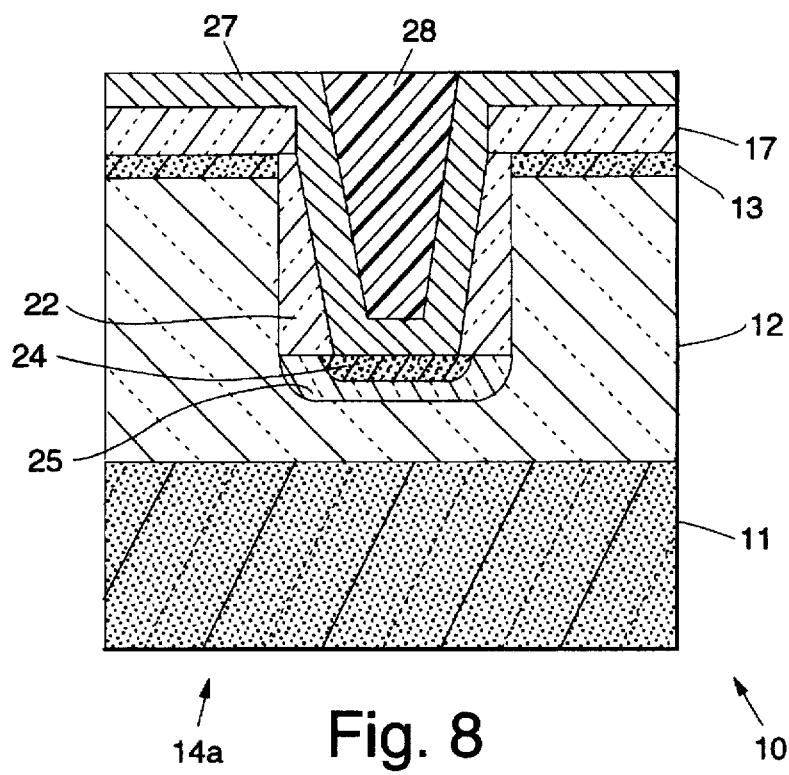

Referring to FIG. 7, a first layer of metal 27 is then deposited on top of the transistor 10 and into the trench 21 to make contact with the gate regions 26. The first layer of metal 27 is deposited to a thickness on the order of 6000 Å. Referring to FIG. 8, photoresist 28 is deposited over the top surface of the transistor 10, and the photoresist 28 is planarized. Then, the first layer of metal 27 along with the planarized layer of photoresist 28 are planarized to produce the structure shown in FIG. 8.

Figure 9:
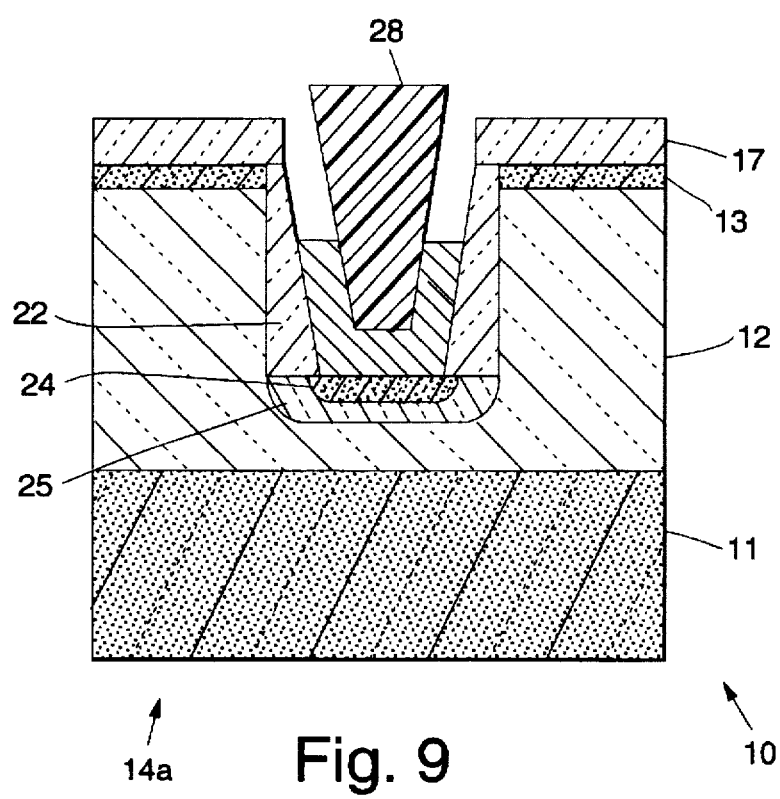

Referring to FIG. 9, the first layer of metal 27 is etched using a dry or wet etch, for example, to a predetermined depth below the top surface of the trench 21. The depth to which the metal in the trench is removed is not significant. The first layer of metal 27 must be removed from the surface of thick oxide layer 17 and also from the side of the trench 21. In order to accomplish this result, the metal 27 must be etched beyond the point where merely the horizontal layer of metal 27 is removed. In other words, the first layer of metal 27 must be overetched. It has been determined that overetching by a factor of 100 to 300 percent is required in order to achieve a structure such as shown in FIG. 9.

Figure 10:
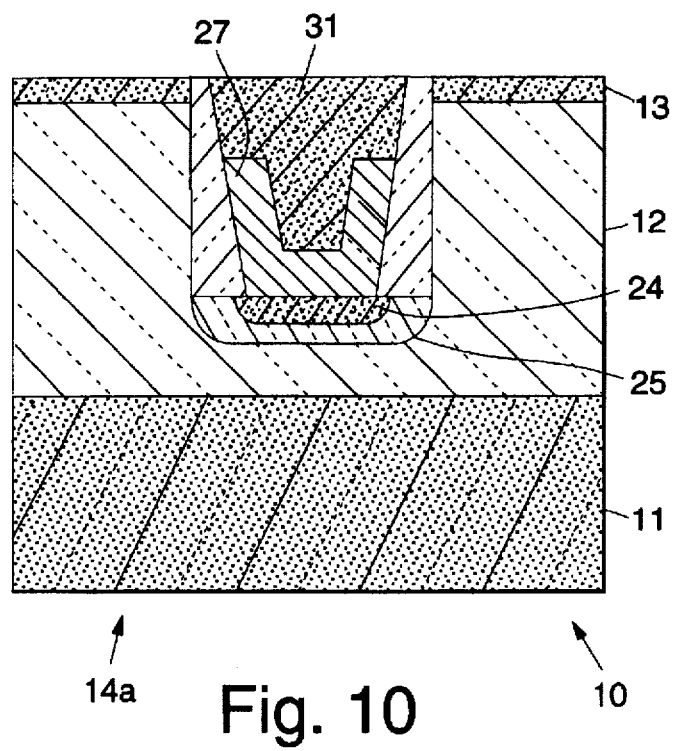
Figure 14A:
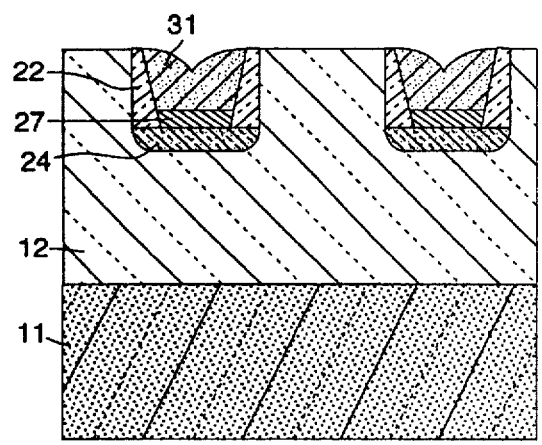
FIGS. 14a and 14b show the structures of FIGS. 13a and 13b after a planarizing etch.
Figure 14B:
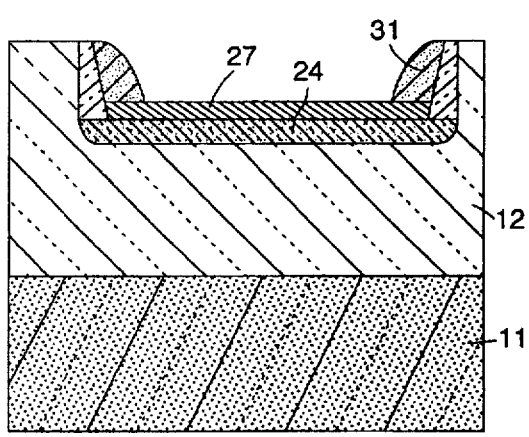

The photoresist 28 is stripped from the transistor 10 using $O_2$ plasma, for example. Then, a plasma nitride layer is deposited onto the top surface of the transistor 10. As shown in FIGS. 13a and 13b, the narrow trenches over the source regions become completely filled with the plasma nitride material whereas the wide trenches over the gate contacts are not filled in the center portion, i.e. are only partially filled, with the plasma nitride material. The plasma nitride layer is then planarized by an anisotropic etch to form the layer 31 shown in FIG. 10. By this planarization step, contact to the gate is opened as shown in FIG. 14b without the use of a mask and this is referred to herein as a "maskless" process. Thus, the present process eliminates the prior art step which required forming a mask and etching through the mask to open a contact to the gate. The transistor structure shown in FIG. 10 is produced along with self-aligned contacts to the first layer of metal 27 (gate). An undoped oxide layer (not shown) is then deposited onto the top surface of the transistor 10 to a thickness on the order of 1000 Å, and a prepad mask 33 (FIG. 1) is formed over the undoped oxide layer and the oxide is etched and the mask is stripped.

Figure 11:
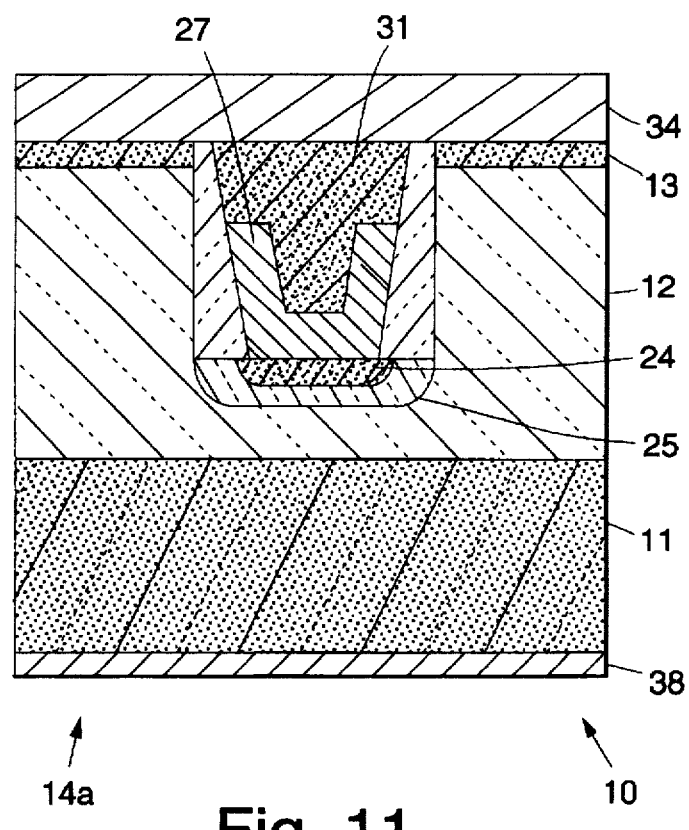

Referring to FIG. 11, a second metal layer 34 is then deposited on the top surface of the transistor 10. The second metal layer 34 connects to respective source and gate regions of the transistor 10. The second metal layer 34 is then masked and etched using a metal mask (not shown) to form a metal pad. Next, a passivation layer (not shown) is deposited on top of the masked second metal layer 34. The passivation layer is masked using a passivation mask (not shown), and an interconnecting pad is formed by etching through the passivation layer. A drain contact 38 (typically gold) is formed on the bottom surface of the substrate 11. This completes fabrication of the self-aligned static induction transistor 10.

Figure 12:
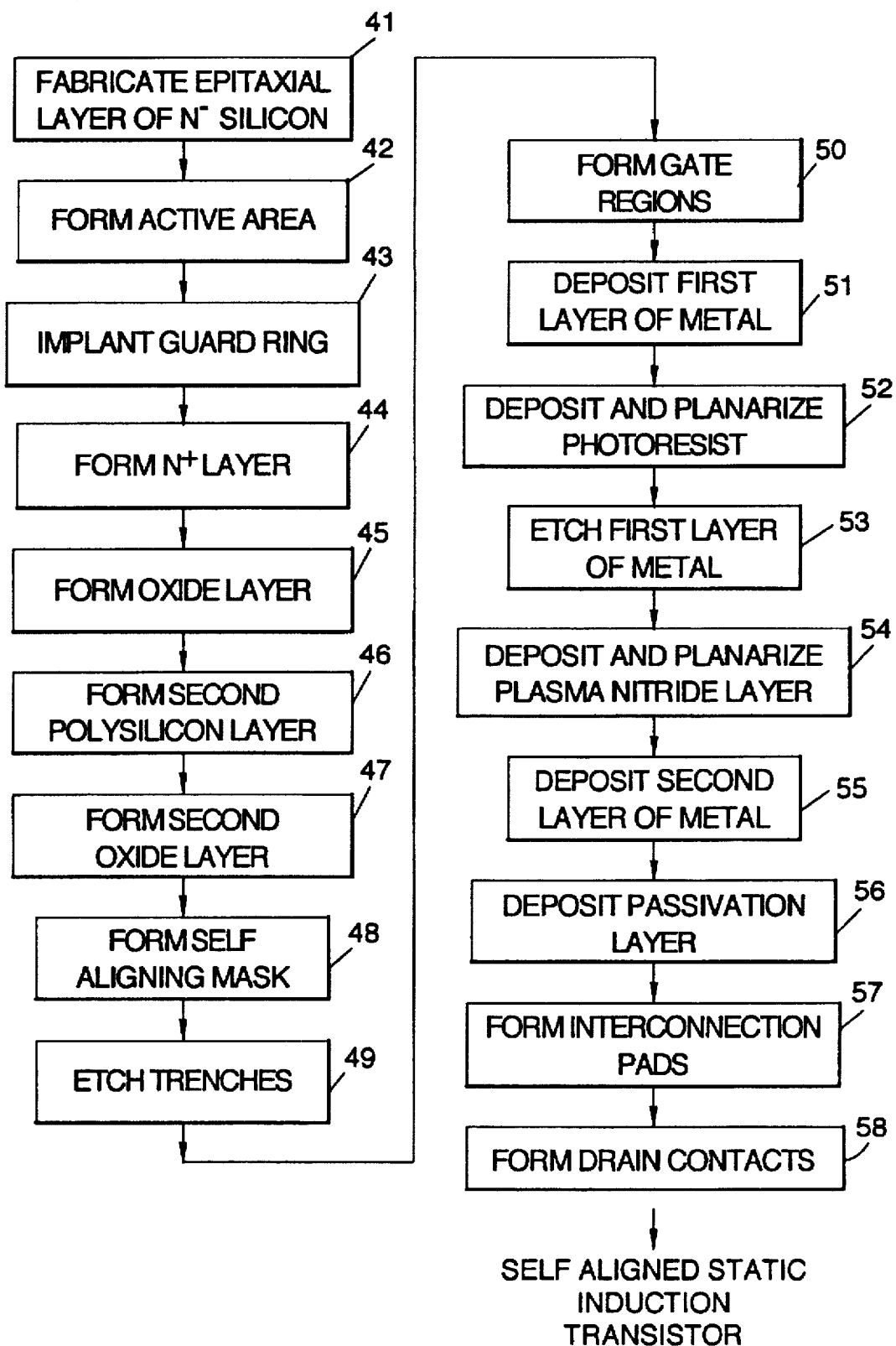
FIG. 12 is a flow diagram summarizing the steps in the method of the present invention.

For the purposes of completeness, and referring to FIG. 12, it shows a flow diagram summarizing the steps in the method 40 of the present invention. The processing steps are as follows. An $N^-$ silicon epitaxial layer on $N^+$ silicon substrate 11 is fabricated, as in step 41. An active area 14a is formed on the substrate 11, indicated in step 42. A guard ring 15 surrounding the active area 14a is formed, indicated in step 43. An $N^+$ layer 13 is formed on the substrate 11 that comprises source and gate regions of the transistor 10, indicated in step A self-aligned relatively deep trench is then formed in accordance with the principles of the present invention. To achieve this, an oxide layer 17 is formed on top of the $N^+$ silicon layer 13, indicated in step 45. A polysilicon layer 18 is formed on top of the layer of oxide 17, indicated in step 46. A second oxide layer 19 is formed on top of the second polysilicon layer 18, indicated in step 47. A self-aligning mask 20 is formed on the second oxide layer 19, indicated in step 48, and trenches 21 are etched into the substrate 11 through the self-aligning mask 20, indicated in step 49.

Maskless self-aligned gate metallization is then formed at the bottom of the trenches 21, indicated in step 50. This is accomplished by depositing a first layer of metal 17 to make contact with the gate regions 26, indicated in step 51. A layer of photoresist 28 is deposited on the surface of the transistor 10 and planarized, indicated in step 52. The first layer of metal 27 is etched to a predetermined depth below the top surface of the trenches 21, indicated in step 53. A layer of plasma nitride 31 is deposited on the surface of the transistor 10 and planarized, indicated in step 54. This step 54 is a maskless step that produces self-aligned contacts to the first layer of metal 27 (gate metallization). A second layer of metal 34 is deposited on top of the transistor 10 to make contact with the source and gate regions, indicated in step

55. A passivation layer is deposited on top of the transistor 10, indicated in step 56. Interconnection pads that connect to the first and second layers of metal 27, 34 are then formed, indicated in step 57. Drain contacts 38 are then formed on the substrate 11, as indicated in step 58. This completes fabrication of the self-aligned static induction transistor 10.

In view of the above, it should be seen that the present method 40 provides for the fabrication of a self-aligned static induction transistor, and the transistor 10 is fabricated using one minimum geometry mask (the trench mask 20). The present invention provides for higher transconductance and $f_t$ in the fabricated static induction transistor 10. In addition, the unity gain frequency, or cutoff frequency ($f_t$) of the fabricated static induction transistor 10 is increased, resulting in a faster speed of operation, on the order of several gigahertz. The present invention also provides for variable operational voltage by controlling the sidewall thickness of the trench 21.

Thus there has been described a new and improved method for fabricating self-aligned static induction transistors. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A method of making a self-aligned static induction transistor comprising the steps of:

fabricating a silicon substrate having a top surface and a bottom surface;

forming an active area on the top surface of the substrate;

forming a guard ring surrounding the active area;

forming source and gate regions on the substrate;

forming self-aligned deep trenches in the source and gate regions wherein each trench has a top surface and a bottom surface and wherein said trenches in said source regions are relatively narrow and said trenches in said gate regions are relatively wide;

forming maskless self-aligned gate metallization in the bottom of said trenches;

depositing a layer of plasma nitride on the surface of the transistor to completely fill the relatively narrow trenches in the source regions and partially fill the relatively wide trenches in the gate regions;

planarizing the plasma nitride layer whereby contacts are opened to the gate metallization in the gate region;

forming source metallization on the source region; and forming a drain contact on the bottom surface of the substrate to complete the self-aligned static induction transistor.

2. The method of claim 1 wherein the step of forming the self-aligned deep trenches comprises the steps of:

forming an oxide layer on the source and gate regions;

forming a polysilicon layer on the oxide layer;

forming a second oxide layer on the polysilicon layer;

forming a self-aligning mask on the second oxide layer; and etching trenches in the source and gate regions using the self-aligning mask.

3. The method of claim 1 wherein the step of forming maskless self-aligned gate metallization comprises the steps of:

depositing a first layer of metal to make contact with the gate regions in the trenches;

depositing and planarizing a layer of photoresist on the surface of the first layer of metal; and etching the first layer of metal to a predetermined depth below the top surfaces of the trenches.

4. The method of claim 1 which further comprises the step of depositing a passivation layer on the source and gate metallizations.

5. The method of claim 2 wherein the step of etching the trenches comprises the step of anisotropically etching the trenches to produce relatively vertical walls of the trenches.

6. The method of claim 1 wherein the step of forming source and gate regions on the substrate comprises the step of implanting and diffusing $N^+$ dopant ions into the substrate.

7. The method of claim 6 wherein the step of forming maskless self-aligned gate metallization further comprises the steps of:

growing gate oxide in the trenches;

forming a P-grade layer adjacent the bottom of the trenches; and depositing P+ dopant ions into the P-grade layer to form the gate regions.

8. The method of claim 7 wherein the step of depositing $P^+$ dopant ions comprises the steps of:

implanting $P^+$ dopant ions into the P-grade layer; and annealing the implanted P-grade layer.

9. The method of claim 2 wherein the step of etching the trenches comprises providing a variable sidewall trench oxide thickness to provide for higher or lower breakdown voltages according to the thickness, and wherein a thicker layer of thermal oxide along the sidewalls allows for a more graded gate junction.

10. The method of claim 3 wherein the step of etching the first layer of metal comprises overetching the first layer of metal by a factor of 100 to 300 percent.

11. A method of making a self-aligned static induction transistor, said method comprising the steps of:

fabricating an $N^-$ silicon layer on an $N^+$ silicon substrate;

forming an active area on the substrate;

forming a guard ring surrounding the active area;

forming an $N^+$ layer in the substrate that comprises source and gate regions of the transistor;

forming an oxide layer on the $N^+$ layer;

forming a polysilicon layer on the oxide layer;

forming a second oxide layer on the polysilicon layer;

forming a self-aligning mask on the second oxide layer;

etching trenches into the source and gate regions using the self-aligning mask wherein said trenches in said source regions are relatively narrow and said trenches in said gate regions are relatively wide;

forming gate regions at the bottom of the trenches in said gate regions;

depositing a first layer of metal on top of the transistor to make contact with the gate regions;

depositing and planarizing a layer of photoresist on the surface of the transistor;

etching the first layer of metal to a predetermined depth below the top surface of the trenches;

depositing a layer of plasma nitride on the surface of the first layer of metal to completely fill the trenches in the source regions and partially fill the trenches in the gate regions;

planarizing the plasma nitride layer whereby contacts are opened to the first layer of metal in the gate regions;

depositing a second layer of metal on the transistor to make contact with the source and gate regions;

depositing a passivation layer on the second layer of metal; and forming interconnection pads that connect the first and second layers of metal.

12. The method of claim 11 wherein the step of etching the trenches comprises the step of anisotropically etching the trenches to produce relatively vertical walls of the trenches.

13. The method of claim 11 wherein the step of forming an $N^+$ layer in the substrate comprises the step of implanting and diffusing $N^+$ dopant ions into the substrate.

14. The method of claim 11 wherein the step of forming gate regions at the bottom of the trenches comprises the steps of:

growing gate oxide in the trenches;

forming a P-grade layer adjacent the bottom of the trenches; and depositing $P^+$ dopant ions into the P-grade layer to form the gate regions.

15. The method of claim 14 wherein the step of depositing $P^+$ dopant ions comprises the steps of:

implanting $P^+$ dopant ions into the P-grade layer; and annealing the implanted P-grade layer.

16. The method of claim 11 wherein the step of etching the trenches comprises providing for variable sidewall trench oxide thickness to provide for higher or lower breakdown voltages according to the thickness, and wherein a thicker layer of thermal oxide along the sidewalls allows for a more graded $P^+$ gate junction.

17. The method of claim 11 wherein the step of etching the first layer of metal comprises overetching the first layer of metal by a factor of 100 to 300 percent.

* * * * *